United States Patent
Mattausch et al.

(10) Patent No.: US 9,911,496 B2
(45) Date of Patent: Mar. 6, 2018

(54) ASSOCIATIVE MEMORY FOR REALIZING A K-NEAREST NEIGHBORS ALGORITHM

(71) Applicant: HIROSHIMA UNIVERSITY, Higashi-Hiroshima-shi, Hiroshima (JP)

(72) Inventors: Hans Juergen Mattausch, Hiroshima (JP); Shogo Yamasaki, Hiroshima (JP)

(73) Assignee: HIROSHIMA UNIVERSITY, Higashi-Hiroshima-Shi (JP)

( * ) Notice: Subject to any disclaimer, the term of this patent is extended or adjusted under 35 U.S.C. 154(b) by 0 days.

(21) Appl. No.: 15/009,699

(22) Filed: Jan. 28, 2016

(65) Prior Publication Data

US 2016/0225450 A1     Aug. 4, 2016

(30) Foreign Application Priority Data

Jan. 30, 2015   (JP) .................................. 2015-016977

(51) Int. Cl.
*G11C 15/04*    (2006.01)
*G06F 17/30*    (2006.01)

(52) U.S. Cl.
CPC ........ *G11C 15/04* (2013.01); *G06F 17/30982* (2013.01)

(58) Field of Classification Search
CPC .......................... G11C 15/04; G06F 17/30982
USPC ...................................................... 365/49.17
See application file for complete search history.

(56) References Cited

U.S. PATENT DOCUMENTS

| | | | | |
|---|---|---|---|---|
| 5,805,493 A | * | 9/1998 | Konishi | G06F 17/30982 365/49.17 |
| 5,893,137 A | * | 4/1999 | Parks | G11C 15/04 707/E17.04 |
| 6,934,795 B2 | * | 8/2005 | Nataraj | G06F 17/30982 707/E17.035 |
| 9,824,162 B1 | * | 11/2017 | Shoham | G06F 17/30982 |

(Continued)

FOREIGN PATENT DOCUMENTS

WO    WO 2015011907 A1 *   1/2015 ............. G11C 15/04

OTHER PUBLICATIONS

Yuji Yano et. al. , "Associative Memory for High-Speed Nearest Hamming/Manhattan Distance Search with Large Reference Pattern Number", Internet Publication/ poster, 2004.*

(Continued)

*Primary Examiner* — Anthan Tran
*Assistant Examiner* — Mushfique Siddique
(74) *Attorney, Agent, or Firm* — Maschoff Brennan

(57) ABSTRACT

A k-nearest neighbors associative memory includes: a clock counting type associative memory that holds R pieces of reference data and outputs, for each of the R pieces of reference data, a match signal that becomes active when a clock count corresponding to a distance between the reference data and given search data has been reached; and a k-nearest neighbors clustering circuit that, every time at least one of the R match signals output from the clock counting type associative memory becomes active, selects a piece of class data, out of R pieces of class data representing classes of the R pieces of reference data, corresponding to each of the at least one active match signal, until k match signals out of the R match signals become active, and determines a class having a largest number of pieces of data when the selected total k pieces of class data are classified.

5 Claims, 10 Drawing Sheets

(56) References Cited

U.S. PATENT DOCUMENTS

| | | | |
|---|---|---|---|
| 2007/0003135 A1* | 1/2007 | Mattausch | G06K 9/6272 |
| | | | 382/159 |
| 2011/0026840 A1* | 2/2011 | Tao | G06K 9/00684 |
| | | | 382/224 |
| 2015/0112910 A1* | 4/2015 | McCormick | G06N 3/04 |
| | | | 706/27 |

OTHER PUBLICATIONS

Toshinobu Akazawa et. al. , "Associative memory architecture for word-parallel smallest Euclidean distance search using distance mapping into clock-number domain", Japanese Journal of Applied Physics, 2014.*

F. An. et. al , "Highly flexible nearest-neighbor-search associative memory with integrated k nearest neighbor classifier, configurable parallelism and dual-storage space", Japanese Journal of Applied Physics, 2016.*

Translation of ISR and pct opinion of WO 2015011907 A1, dated Jan. 29, 2015.*

S.Sasaki et al., "Digital Associative Memory for Word-Parallel Manhattan-Distance-Based Vector Quantization," ESSCIRC'2012, pp. 185-188, Sep. 17-21, 2012.

M.A.Abedin et al., "Realization of K—the Specification Nearest-Matches Search Capability in Fully-Parallel Associative Memories," IEICE Trans. on Fundamentals, vol. E90-A, No. 6, pp. 1240-1243, Jun. 2007.

* cited by examiner

ASSOCIATIVE MEMORY FOR REALIZING A K-NEAREST NEIGHBORS ALGORITHM

CROSS-REFERENCE TO RELATED APPLICATIONS

This application claims priority to Japanese Patent Application No. 2015-016977 filed on Jan. 30, 2015, the entire disclosure of which is incorporated by reference herein.

BACKGROUND

The present disclosure relates to an associative memory, and more particularly to an associative memory that effectively realizes a k-nearest neighbors algorithm.

In recent years, applications requiring pattern matching typified by character recognition, image recognition, etc. have been attracting great attention. In particular, by realizing pattern matching on large scale integrated circuits (LSIs), pattern matching will become applicable to high-function applications such as artificial intelligence and mobile equipment in the future. Realization of this technology has therefore been receiving much attention.

In the pattern matching, there are "perfect matching search approach" of searching for a pattern completely matching with search data, and "most similar search approach" of searching for a pattern most similar to search data, through a plurality of pieces of reference data stored in a database.

The former search approach, using a content addressable memory (CAM), is used for realization of routing in IP address tables of network routers, caches of processors, etc. In order to make computers perform processing of such flexible searching and comparison as those performed by human brains, it is indispensable to realize the latter search approach, the most similar search approach. A memory having a function of realizing such flexible comparison is especially called an "associative memory."

As an example of the associative memory, known is one where the most similar search is performed using Manhattan distance or Euclidean distance between search data and reference data (e.g., S. Sasaki et al., "Digital Associative Memory for Word-Parallel Manhattan-Distance-Based Vector Quantization," ESSCIRC' 2012, 2012, pp. 185-188). Also known is an associative memory where k-nearest neighbors search is adopted (e.g., M. A. Abedin et al., "Realization of K-Nearest-Matches Search Capability in Fully-parallel Associative Memories," IEICE Trans. on Fundamentals, vol. E90-A, No. 6, 2007, pp. 1240-1243).

A k-nearest neighbors algorithm is often used as a machine learning algorithm in the field of pattern recognition. The k-nearest neighbors algorithm has high reliability in pattern recognition. In the prior art, while the k-nearest neighbors search is adopted in associative memories, the k-nearest neighbors algorithm has not been effectively realized. In particular, the prior art has not reached the point of realizing pattern classification based on the k-nearest neighbors algorithm.

In relation to the above problem, the present inventors invented a k-nearest neighbors associative memory that can effectively realize the k-nearest neighbors algorithm, and disclosed the invented memory under PCT/JP2014/003809 (hereinafter referred to as prior application).

SUMMARY

The k-nearest neighbors associative memory according to an embodiment of the disclosure includes: a clock counting type associative memory that holds R pieces of reference data and outputs, for each of the R pieces of reference data, a match signal that becomes active when a clock count corresponding to a distance between the reference data and given search data has been reached; and a k-nearest neighbors clustering circuit that, every time at least one of the R match signals output from the clock counting type associative memory becomes active, selects a piece of class data, out of R pieces of class data representing classes of the R pieces of reference data, corresponding to each of the at least one active match signal, until any k match signals out of the R match signals become active, and determines a class having a largest number of pieces of data when the selected total k pieces of class data are classified by class.

According to the above configuration, the distance between search data and each piece of reference data is converted to the clock count by the clock counting type associative memory, whereby a match signal corresponding to the piece of reference data becomes active at the timing corresponding to the distance. A class having the largest number of pieces of data when k pieces of class data corresponding to k match signals that have become active earlier are classified by class is determined by the k-nearest neighbors clustering circuit. In this way, classification of search data based on the k-nearest neighbors algorithm is realized.

BRIEF DESCRIPTION OF THE DRAWINGS

The figures depict one or more implementations in accord with the present teachings, by way of example only, not by way of limitations. In the figures, like reference numerals refer to the same or similar elements.

DETAILED DESCRIPTION

Embodiments are described in detail below with reference to the attached drawings. However, unnecessarily detailed description may be omitted. For example, detailed description of well known techniques or description of substantially the same elements may be omitted. Such omission is intended to prevent the following description from being unnecessarily redundant and to help those skilled in the art easily understand it.

The inventors provide the following description and the attached drawings to enable those skilled in the art to fully understand the present disclosure. Thus, the description and the drawings are not intended to limit the scope of the subject matter defined in the claims.

Figure 1:
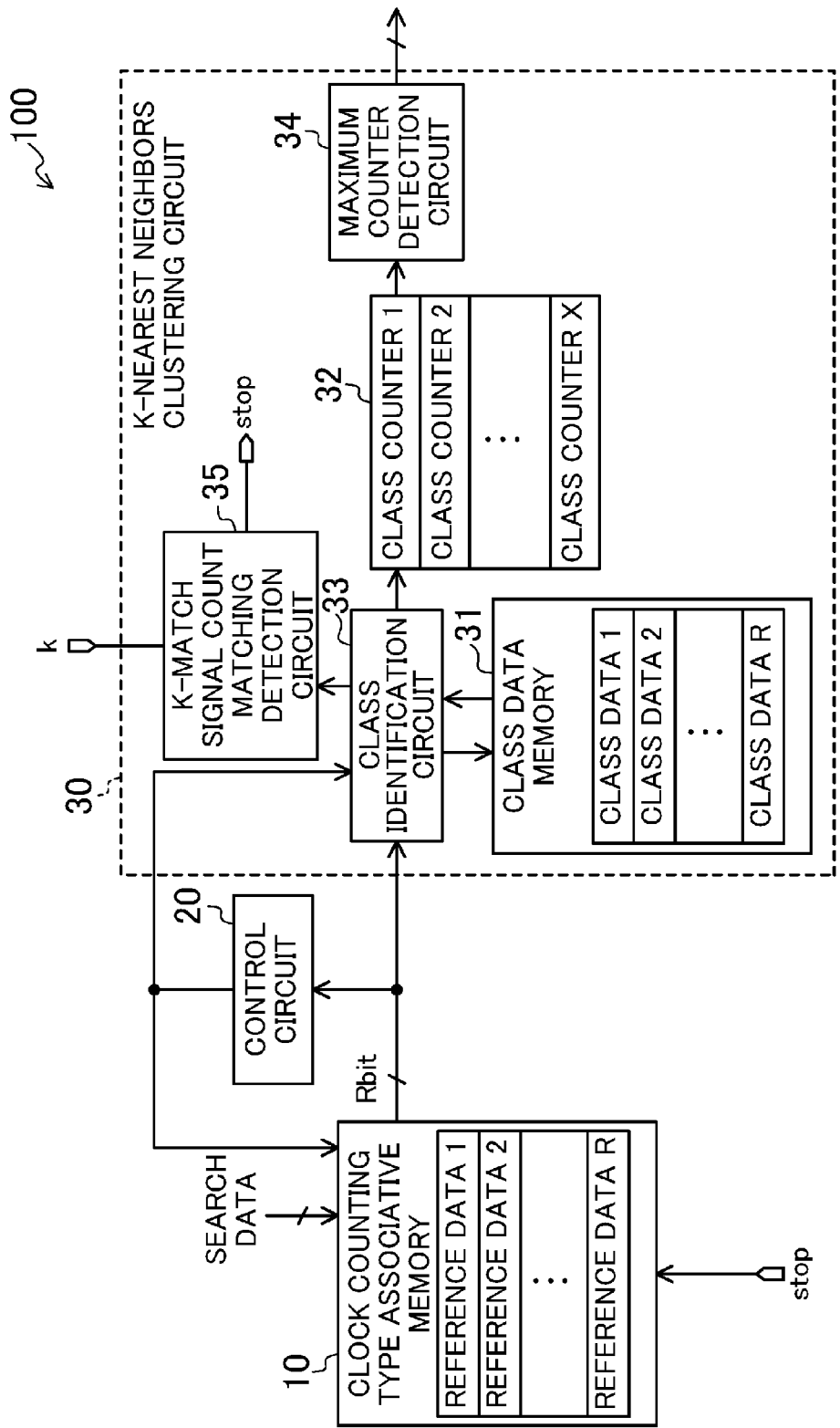
FIG. 1 is a schematic block diagram of a k-nearest neighbors associative memory according to an embodiment of the disclosure.

FIG. 1 illustrates a schematic configuration of a k-nearest neighbors associative memory 100 according to an embodiment of the disclosure. The k-nearest neighbors associative memory 100 includes a clock counting type associative memory 10, a control circuit 20, and a k-nearest neighbors clustering circuit 30.

The clock counting type associative memory 10 is a circuit that holds R pieces of reference data (reference data 1, reference data 2, . . . , and reference data R) and outputs, for each of the R pieces of reference data, a match signal that becomes active when the clock count corresponding to the distance between the reference data and given search data has been reached. Note that the "distance" includes the Manhattan distance, the Euclidean distance, etc. Also, becoming "active" refers to a transition of a signal from its low (L) level to its high (H) level in the positive logic and a transition of a signal from the H level to the L level in the negative logic. For the sake of convenience, the positive logic will be assumed in the following description.

The control circuit 20 is a circuit that controls the operations of the clock counting type associative memory 10 and the k-nearest neighbors clustering circuit 30.

The k-nearest neighbors clustering circuit 30 is a circuit that selects, from R pieces of class data (class data 1, class data 2, . . . , and class data R) representing the classes of the R pieces of reference data, k pieces of class data corresponding to k active match signals output from the clock counting type associative memory 10, and determines a class having the largest number of pieces of data when the k pieces of class data are classified by class.

The k-nearest neighbors associative memory 100, having the above three circuits, can determine into which class given search data is to be classified based on the k-nearest neighbors algorithm. An example configuration of each of the circuits will be described hereinafter.

<Example Configuration of Clock Counting Type Associative Memory 10>

Figure 2:
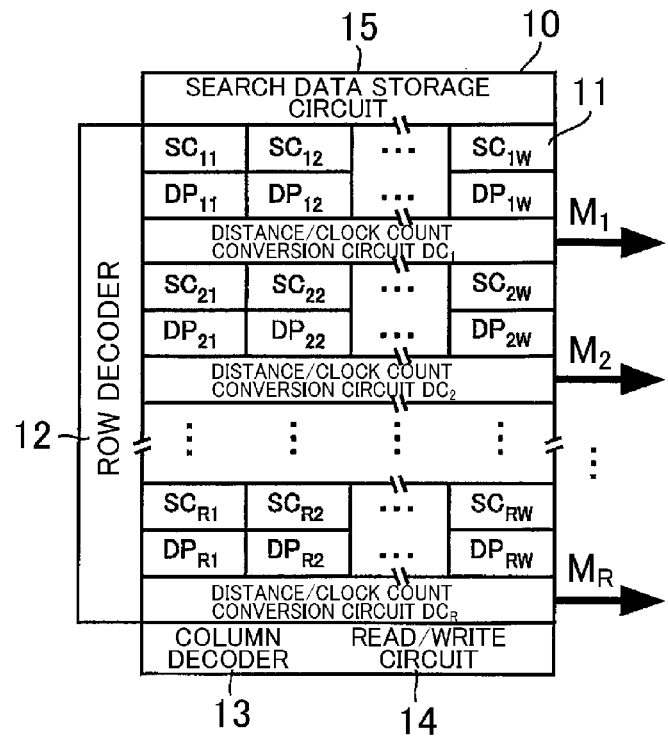
FIG. 2 is a schematic block diagram of an example clock counting type associative memory.

FIG. 2 illustrates a schematic configuration of an example of the clock counting type associative memory 10. The clock counting type associative memory 10 includes a memory section 11, a row decoder 12, a column decoder 13, a read/write circuit 14, and a search data storage circuit 15.

The memory section 11 includes reference data storage cells $SC_{11}$ to $SC_{1W}$, $SC_{21}$ to $SC_{2W}$, . . . , and $SC_{R1}$ to $SC_{RW}$, distance (i.e., absolute value difference) processors $DP_{11}$ to $DP_{1W}$, $DP_{21}$ to $DP_{2W}$, . . . , and $DP_{R1}$ to $DP_{RW}$, and distance/clock count conversion circuits $DC_1$ to $DC_R$, where W and R are integers equal to or more than 2.

The distance processors $DP_{11}$ to $DP_{1W}$ are respectively provided to correspond to the reference data storage cells $SC_{11}$ to $SC_{1W}$, and the distance processors $DP_{21}$ to $DP_{2W}$ are respectively provided to correspond to the reference data storage cells $SC_{21}$ to $SC_{2W}$. Similarly, the distance processors $DP_{R1}$ to $DP_{RW}$ are respectively provided to correspond to the reference data storage cells $SC_{R1}$ to $SC_{RW}$.

The distance/clock count conversion circuit $DC_1$ is provided to correspond to the distance processors $DP_{11}$ to $DP_{1W}$, and the distance/clock count conversion circuit $DC_2$ is provided to correspond to the distance processors $DP_{21}$ to $DP_{2W}$. Similarly, the distance/clock count conversion circuit $DC_R$ is provided to correspond to the distance processors $DP_{R1}$ to $DP_{RW}$.

The reference data storage cells $SC_{11}$ to $SC_{1W}$, $SC_{21}$ to $SC_{2W}$, . . . , and $SC_{R1}$ to $SC_{RW}$ store reference data written by the row decoder 12, the column decoder 13, and the read/write circuit 14. Specifically, the reference data storage cells $SC_{11}$ to $SC_{1W}$ store the reference data 1 of M×W (M is an integer equal to or more than 1) bits, and the reference data storage cells $SC_{21}$ to $SC_{2W}$ store the reference data 2 of M×W bits. Similarly, the reference data storage cells $SC_{R1}$ to $SC_{RW}$ store the reference data R of M×W bits. In other words, each group of the reference data storage cells $SC_{11}$ to $SC_{1W}$, $SC_{21}$ to $SC_{2W}$, . . . , and $SC_{R1}$ to $SC_{RW}$ stores M×W bits of reference data.

The distance processors $DP_{11}$ to $DP_{1W}$ compute the distance between the reference data 1 of M×W bits stored in the reference data storage cells $SC_{11}$ to $SC_{1W}$ and search data of M×W bits stored in the search data storage circuit 15 in a manner described later. The distance processors $DP_{21}$ to $DP_{2W}$ compute the distance between the reference data 2 of M×W bits stored in the reference data storage cells $SC_{21}$ to $SC_{2W}$ and the search data of M×W bits stored in the search data storage circuit 15 in the manner described later. Similarly, the distance processors $DP_{R1}$ to $DP_{RW}$ compute the distance between the reference data R of M×W bits stored in the reference data storage cells $SC_{R1}$ to $SC_{RW}$ and the search data of M×W bits stored in the search data storage circuit 15 in the manner described later. Such computations of the distances between the reference data and the search data by the distance processors $DP_{11}$ to $DP_{1W}$, $DP_{21}$ to $DP_{2W}$, . . . , and $DP_{R1}$ to $DP_{RW}$ are performed in parallel.

The distance processors $DP_{11}$ to $DP_{1W}$ output the distance between the reference data 1 and the search data to the distance/clock count conversion circuit $DC_1$ as a distance signal of M×W bits. The distance processors $DP_{21}$ to $DP_{2W}$ output the distance between the reference data 2 and the search data to the distance/clock count conversion circuit $DC_2$ as a distance signal of M×W bits. Similarly, the distance processors $DP_{R1}$ to $DP_{RW}$ output the distance between the reference data R and the search data to the distance/clock count conversion circuit $DC_R$ as a distance signal of M×W bits.

The distance processors $DP_{11}$ to $DP_{1W}$ compute the distance between the reference data 1 and the search data using Equation (1) below.

$$n_{Mr} = \sum_{j=1}^{W} D_{rj} = \sum_{j=1}^{W} |I_{nj} - R_{erj}| \qquad (1)$$

where $D_{rj}$ (r=1 to R, j=1 to W) denotes the distance (absolute value difference) between the reference data and the search data, $n_{Mr}$ denotes the Manhattan difference between the reference data and the search data, $I_{nj}$ denotes search data, and $R_{erj}$ denotes reference data. The data $I_{nj}$ and $R_{erj}$ are each made of M bits.

As described above, the distance processors $DP_{11}$ to $DP_{1W}$ compute the distance between the reference data 1 of M×W bits and the search data of M×W bits by M bits each, and output W distance signals $D_{1j}$ each having a bit length of M bits to the distance/clock count conversion circuit $DC_1$.

Similarly, the distance processors $DP_{21}$ to $DP_{2W}$, . . . , and $DP_{R1}$ to $DP_{RW}$ respectively compute the distances between the reference data 2, . . . , and the reference data R and the search data using Equation (1). The distance processors $DP_{21}$ to $DP_{2W}$, . . . , and $DP_{R1}$ to $DP_{RW}$ then output W distance signals $D_{2j}$, . . . , and W distance signals $D_{Rj}$ each having a bit length of M bits to the distance/clock count conversion circuits $DC_2$ to $DC_R$, respectively.

The distance/clock count conversion circuit $DC_1$, receiving the W distance signals $D_{1j}$ from the distance processors $DP_{11}$ to $DP_{1W}$, counts the number of clocks CN_total1 of a clock signal CLK that corresponds to the sum of the square values of the distance signals $D_{1j}$ in a manner described later. The distance/clock count conversion circuit $DC_1$ then outputs a match signal $M_1$ representing the timing at which the number of clocks CN_total1 has been counted.

The distance/clock count conversion circuit $DC_2$, receiving the W distance signals $D_{2j}$ from the distance processors $DP_{21}$ to $DP_{2W}$, counts the number of clocks CN_total2 of the clock signal CLK that corresponds to the sum of the square values of the distance signals $D_{2j}$ in the manner described later. The distance/clock count conversion circuit $DC_2$ then outputs a match signal $M_2$ representing the timing at which the number of clocks CN_total2 has been counted.

Similarly, the distance/clock count conversion circuit $DC_R$, receiving the W distance signals $D_{Rj}$ from the distance processors $DP_{R1}$ to $DP_{RW}$, counts the number of clocks CN_totalR of the clock signal CLK that corresponds to the sum of the square values of the distance signals $D_{Rj}$ in the manner described later. The distance/clock count conversion circuit $DC_R$ then outputs a match signal $M_R$ representing the timing at which the number of clocks CN_totalR has been counted.

The row decoder 12 designates addresses in the row direction in the memory section 11. The column decoder 13 designates addresses in the column direction in the memory section 11. The read/write circuit 14 writes reference data into any of the reference data storage cells $SC_{11}$ to $SC_{1W}$, $SC_{21}$ to $SC_{2W}$, ..., and $SC_{R1}$ to $SC_{RW}$ designated by the row decoder 12 and the column decoder 13, and also writes search data into the search data storage circuit 15.

The search data storage circuit 15 stores search data (M×W bits) written by the read/write circuit 14.

Figure 3:
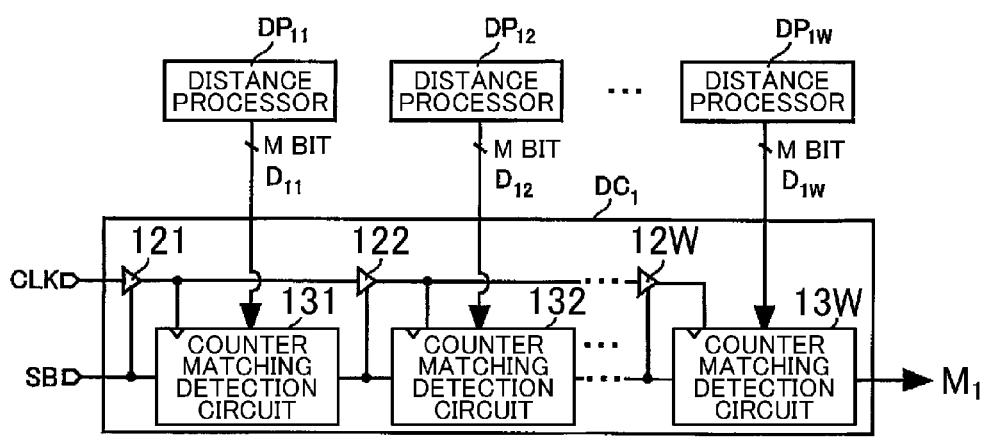
FIG. 3 is a schematic block diagram of an example distance/clock count conversion circuit.

FIG. 3 illustrates a schematic configuration of an example of the distance/clock count conversion circuit $DC_1$. Note that the distance/clock count conversion circuits $DC_2$ to $DC_R$ also have a configuration similar to that of the distance/clock count conversion circuit $DC_1$ shown in FIG. 3. The distance/clock count conversion circuit $DC_1$ includes buffers 121 to 12W and counter matching detection circuits 131 to 13W.

The buffer 121 receives a search start signal SB from a control circuit (not shown) of the k-nearest neighbors associative memory 100, and also receives the clock signal CLK from a clock generation circuit (not shown) incorporated in the k-nearest neighbors associative memory 100. When the search start signal SB has made a transition from the L level to the H level, the buffer 121 outputs the received clock signal CLK to the buffer 122 and the counter matching detection circuit 131. When having received the clock signal CLK from the buffer 121 and also received an H-level matching signal (DETECT1) described later from the counter matching detection circuit 131, the buffer 122 outputs the clock signal CLK to the buffer 123 (not shown) and the counter matching detection circuit 132. Similarly, when having received the clock signal CLK from the buffer 12W-1 (not shown) and also received an H-level matching signal (DETECTW-1) described later from the counter matching detection circuit 13W-1 (not shown), the buffer 12W outputs the clock signal CLK to the counter matching detection circuit 13W.

The counter matching detection circuits 131 to 13W are provided to correspond to the distance processors $DP_{11}$ to $DP_{1W}$, and are serially connected to each other. A schematic configuration of the counter matching detection circuits 131 to 13W will be described.

Figure 4:
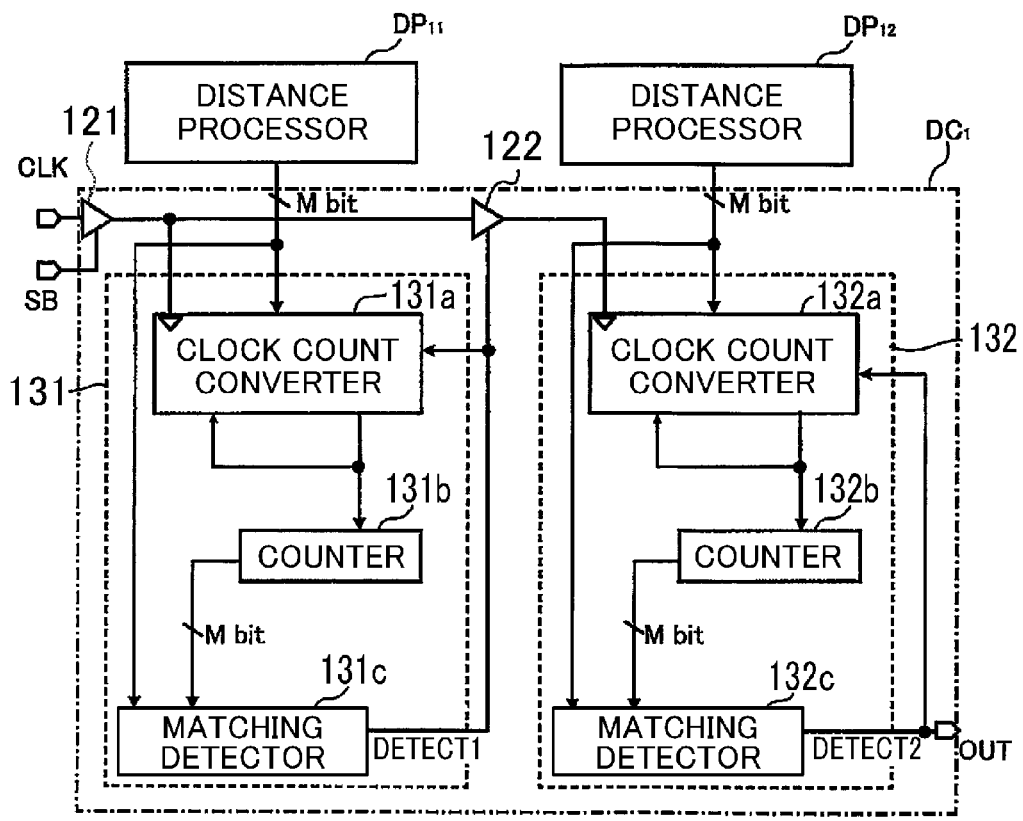
FIG. 4 is a schematic block diagram of an example counter matching detection circuit.

FIG. 4 illustrates a schematic configuration of an example of the counter matching detection circuits 131 to 13W. This example illustrates the case of W=2. The counter matching detection circuit 131 includes a clock count converter 131a, a counter 131b, and a matching detector 131c. The counter matching detection circuit 132 includes a clock count converter 132a, a counter 132b, and a matching detector 132c. The functions of these components will be described hereinafter.

The clock count converter 131a receives the M-bit distance signal $D_{11}$ from the distance processor $DP_{11}$ and the clock signal CLK from the buffer 121. The clock count converter 131a counts the number of clocks of the clock signal CLK and outputs an H-level matching detection signal to the counter 131b at the timing of detection of the number of clocks matching with the distance indicated by the distance signal $D_{11}$. The clock count converter 131a repeats this processing until an H-level matching signal (DETECT1) is output from the matching detector 131c described later, and stops the operation once the H-level matching signal is output.

The counter 131b increments the counter value by one every time the matching detection signal from the clock count converter 131a rises, and outputs the counter value to the matching detector 131c.

The matching detector 131c receives the counter value from the counter 131b and the M-bit distance signal $D_{11}$ from the distance processor $DP_{11}$. The matching detector 131c compares the distance indicated by the distance signal $D_{11}$ with the counter value, and, if the distance indicated by the distance signal $D_{11}$ matches with the counter value, outputs an H-level matching signal (DETECT1) to the clock count converter 131a and the buffer 122. If the distance indicated by the distance signal $D_{11}$ does not match with the counter value, the matching detector 131c outputs an L-level matching signal (DETECT1) to the clock count converter 131a and the buffer 122.

The clock count converter 132a is driven when having received the clock signal CLK from the buffer 122. The clock count converter 132a receives the M-bit distance signal $D_{12}$ from the distance processor $DP_{12}$. Like the clock count converter 131a, the clock count converter 132a counts the number of clocks of the clock signal CLK, and outputs an H-level matching detection signal to the counter 132b at the timing of detection of the number of clocks matching with the distance indicated by the distance signal $D_{12}$. The clock count converter 132a repeats this processing until an H-level matching signal (DETECT2) is output from the matching detector 132c described later, and stops the operation once the H-level matching signal (DETECT2) is output.

The counter 132b increments the counter value by one every time the matching detection signal from the clock count converter 132a rises, and outputs the counter value to the matching detector 132c.

The matching detector 132c receives the counter value from the counter 132b and the M-bit distance signal $D_{12}$ from the distance processor $DP_{12}$. The matching detector 132c compares the distance indicated by the distance signal $D_{12}$ with the counter value, and, if the distance indicated by the distance signal $D_{12}$ matches with the counter value, outputs an H-level matching signal (DETECT2) to the clock count converter 132a, as well as outputting the H-level matching signal (DETECT2) as the match signal $M_1$. If the distance indicated by the distance signal $D_{12}$ does not match with the counter value, the matching detector 132c outputs an L-level matching signal (DETECT2) to the clock count converter 132a.

An operation will be described herein taking, as an example, the case where the M-bit distance signal $D_{11}$ indicating a distance of "2" is output from the distance processor $DP_{11}$ and the M-bit distance signal $D_{12}$ indicating a distance of "3" is output from the distance processor $DP_{12}$.

The clock count converter 131a, receiving the M-bit distance signal $D_{11}$ indicating the distance "2," counts the number of clocks matching with the distance "2" in synchronization with the clock signal CLK from the buffer 121. Once the counted number of clocks matches with the distance, the clock count converter 131a outputs an H-level matching detection signal. With the rising of the matching detection signal, the counter 131b increments the counter value by one and outputs the counter value indicating "1" to the matching detector 131c. At this time, since the counter value "1" does not match with the distance "2" indicated by the distance signal $D_{11}$, an L-level matching signal (DETECT1) is output from the matching detector 131c.

When the output matching detection signal falls to the L level, the clock count converter 131a resets the counted number of clocks. The clock count converter 131a then counts the number of clocks of the clock signal CLK again, and, once the counted number of clocks matches with the distance "2," outputs an H-level matching detection signal to the counter 131b. With the rising of the matching detection signal, the counter 131b increments the counter value by one and outputs the counter value indicating "2" to the matching detector 131c. Since the counter value "2" matches with the distance "2" indicated by the distance signal $D_{11}$, the matching detector 131c outputs a matching signal (DETECT1) to the buffer 122 and the clock count converter 131a. In other words, at the timing of the number of clocks being "4" from the search start, the H-level matching signal (DETECT1) is output. In response to the H-level matching signal (DETECT1), the clock count converter 131a stops its operation.

Receiving the H-level matching signal (DETECT1) from the matching detector 131c, the buffer 122 outputs the clock signal CLK to the clock count converter 132a. The clock count converter 132a counts the number of clocks of the clock signal CLK in synchronization with the clock signal CLK from the buffer 122. The clock count converter 132a receives the M-bit distance signal $D_{12}$ indicating the distance "3," and outputs an H-level matching detection signal to the counter 132b at the timing of matching of the counted number of clocks with the distance "3." With the rising of the matching detection signal from the clock count converter 132a, the counter 132b increments the counter value by one and outputs the counter value indicating "1" to the matching detector 132c. At this time, since the counter value "1" does not match with the distance "3," an L-level matching signal (DETECT2) is output from the matching detector 132c.

When the output matching detection signal falls to the L level, the clock count converter 132a resets the counted number of clocks. The clock count converter 132a then counts the number of clocks of the clock signal CLK again, and, once the counted number of clocks matches with the distance "3," outputs an H-level matching detection signal to the counter 132b. With the rising of the matching detection signal from the clock count converter 132a, the counter 132b increments the counter value by one and outputs the counter value indicating "2" to the matching detector 132c. At this time, since the counter value "2" does not match with the distance "3," an L-level matching signal (DETECT2) is output from the matching detector 132c.

When the matching detection signal falls to the L level, the clock count converter 132a resets the counted number of clocks again, and counts the number of clocks of the clock signal CLK. Once the counted number of clocks matches with the distance "3," the clock count converter 132a outputs an H-level matching detection signal to the counter 132b. The clock count converter 132a will stop its operation in response to an H-level matching signal (DETECT2). With the rising of the matching detection signal from the clock count converter 132a, the counter 132b increments the counter value by one and outputs the counter value indicating "3" to the matching detector 132c. Since the counter value "3" matches with the distance "3," the matching detector 132c outputs an H-level matching signal (DETECT2) to the clock count conversion signal 132a, as well as outputting the match signal $M_1$. In other words, the number of clocks counted in the clock count converter 132a is "9 (=3+3+3)," and thus the match signal $M_1$ is output at the timing of the number of clocks being "13 (=4+9)" from the search start.

The number of clocks CN_total1, "13," counted in the entire counter matching detection circuits 131 and 132 is the sum of the number of clocks counted in the counter matching detection circuit 131, "4 (=2+2)," and the number of clocks counted in the counter matching detection circuit 132, "9 (=3+3+3)." This is equivalent to counting, by the counter matching detection circuits 131 and 132, the number of clocks matching with the sum of the square value of the distance "2" and the square value of the distance "3."

The distance/clock count conversion circuit $DC_1$ generally receives W distance signals $D_{11}$ to $D_{1W}$, each of which has a bit length of M bits. Therefore, the distance/clock count conversion circuit $DC_1$ receives a distance signal $D_{11}D_{12} \ldots D_{1W}$ having a bit length of M×W bits. The counter matching detection circuit 131 repeatedly counts the number of clocks matching with the distance indicated by the distance signal $D_{11}$ by the number of times matching with the distance. Also, after receiving matching signals from the counter matching detection circuits 131 to 13W-1, the counter matching detection circuits 132 to 13W repeatedly count the numbers of clocks matching with the distance signals $D_{12}$ to $D_{1W}$, respectively, by the numbers of times matching with the respective distances. As a result, the total number of clocks CN_total1 counted in the distance/clock count conversion circuit $DC_1$ is equal to the sum of the numbers of clocks counted in the counter matching detection circuits 131 to 13W. Since the numbers of clocks counted in the counter matching detection circuits 131 to 13W are respectively equivalent to the square values of the distances indicated by the distance signals $D_{11}$ to $D_{1W}$, the total number of clocks CN_total1 counted in the distance/clock count conversion circuit $DC_1$ represents the sum of the square values of the distance signals $D_{11}$ to $D_{1W}$.

Here, an Euclidean distance $n_{Er}$ is expressed by Equation (2) below.

$$n_{Er} = \sum_{j=1}^{W} |I_{nj} - R_{erj}|^2 \qquad (2)$$

The $|I_{nj}-R_{erj}|^2$ in the right side of Equation (2) corresponds with the square value of the distance between the search data and the reference data, $|I_{nj}-R_{erj}|$ in the right side of Equation (1). Therefore, computation of the Euclidean distance $n_{Er}$ is achieved by repeatedly performing, for each of the W distances computed by Equation (1), the processing of counting the number of clocks matching with the distance by the number of times matching with the distance as described above. When this is the case, in the example of FIG. 4, the fact that the counter matching detection circuit 132 outputs the match signal $M_1$ indicating the timing of the number of clocks counted by the entire counter matching detection circuits 131 and 132 is equivalent to searching for reference data similar to the search data by the Euclidean distance $n_{Er}$, and outputting a signal indicating that reference data similar to the search data has been detected. Note that the distance/clock count conversion circuits $DC_2$ to $DC_R$ also output the corresponding match signals $M_2$ to $M_R$ by the same operation as that of the distance/clock count conversion circuit $DC_1$.

Figure 5:
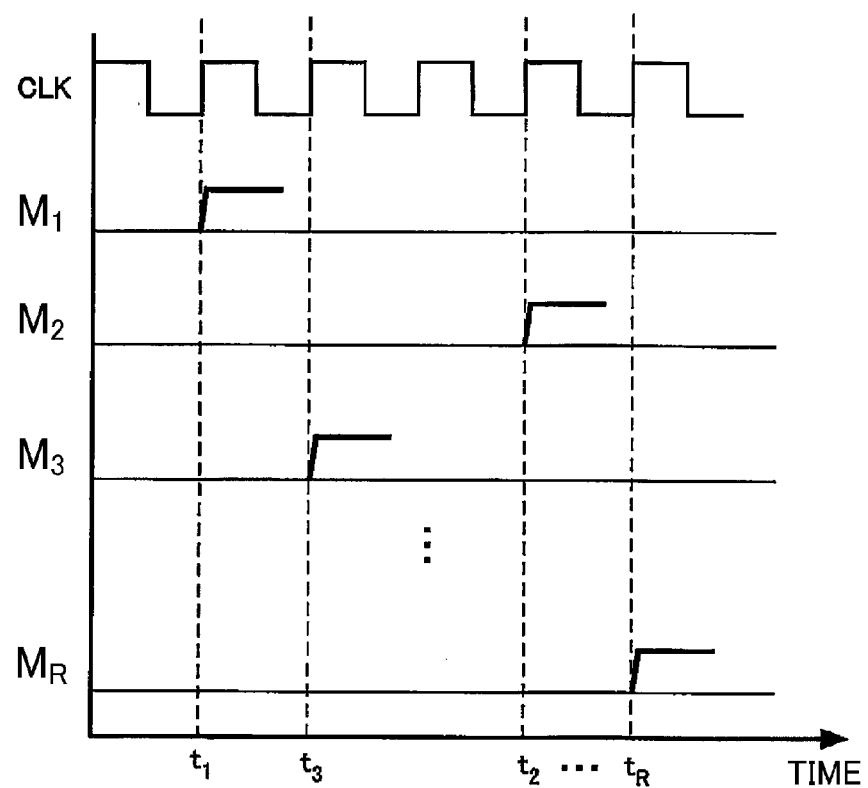
FIG. 5 is a timing chart of example match signals.

FIG. 5 is a timing chart of example match signals. The distance/clock count conversion circuits $DC_1$ to $DC_R$ respectively output the match signals $M_1$ to $M_R$, for example, in synchronization with the clock signal CLK as shown in FIG. 5.

Note that the clock counting type associative memory 10 having the above-described configuration is a mere example, and any clock counting type associative memory that can provide such outputs as those shown in FIG. 5 will be acceptable.

<Configuration Example of Control Circuit 20>

Figure 6:
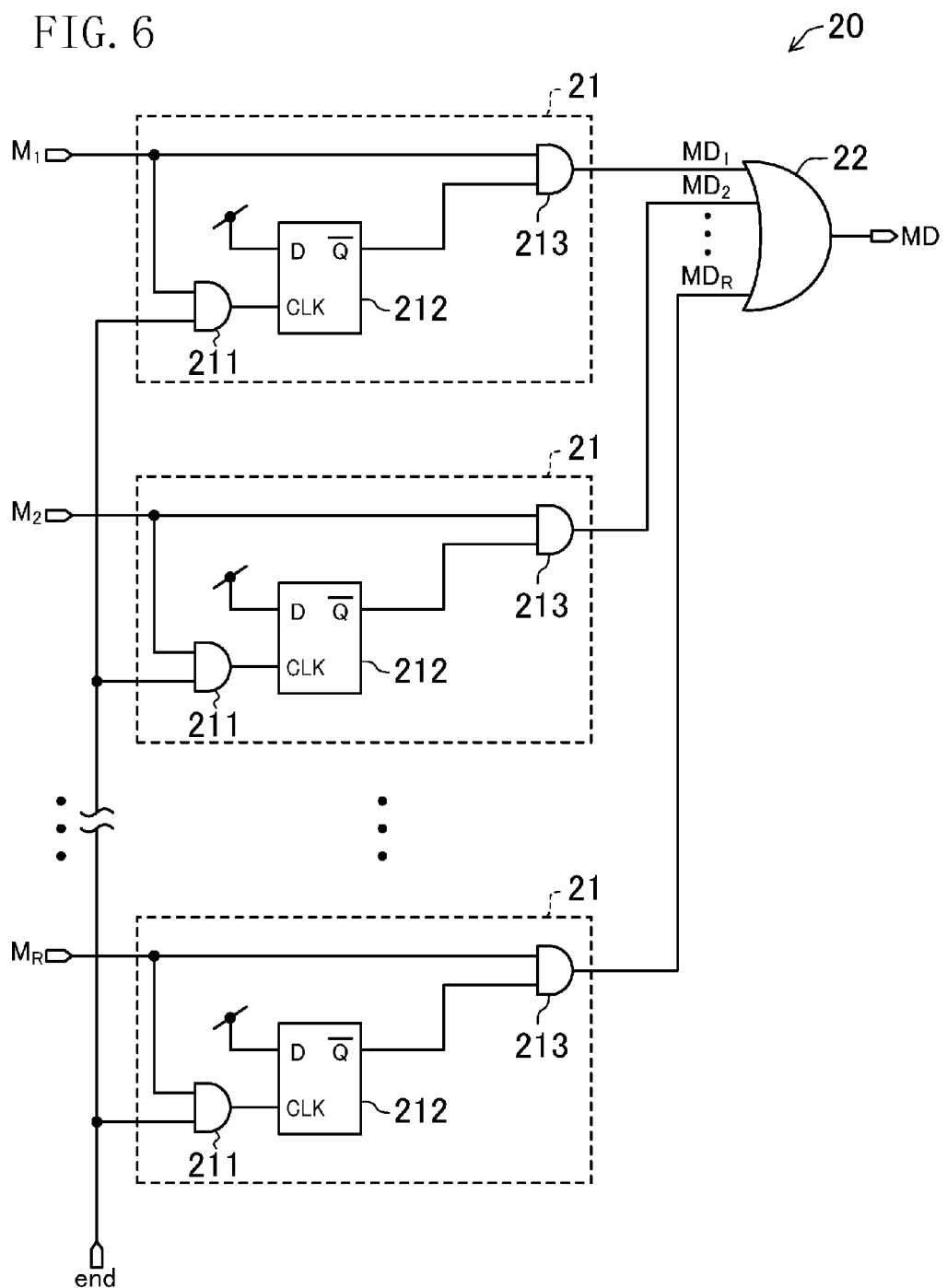
FIG. 6 is a schematic block diagram of an example control circuit.

FIG. 6 illustrates a schematic configuration of an example of the control circuit 20. The control circuit 20 includes: R match signal active detection circuits 21 respectively corresponding to the R match signals $M_1$ to $M_R$ output from the clock counting type associative memory 10; and an OR gate 22 that computes OR of detection signals $MD_1$ to $MD_R$ output from the R match signal active detection circuits 21 and outputs a match signal active detection signal MD. Each of the match signal active detection circuits 21 includes: an AND gate 211 that computes AND of the corresponding match signal $M_i$ (i is an integer of 1 to R) and an end signal end representing termination of class identification operation by a class identification circuit 33 described later; a D flipflop 212 that receives an H-level signal at its data input (D) and an output signal of the AND gate 211 at its clock input (CLK); and an AND gate 213 that computes AND of the match signal $M_i$ and an inverted output of the D flipflop 212 and outputs the detection signal $MD_i$. Although not shown, the D flipflop 212 is reset to its initial state when receiving a reset signal.

With such a circuit configuration, the detection signal $MD_i$ output from the match signal active detection circuit 21 becomes active (H level) when the match signal $M_i$ becomes active (H level), and thereafter, becomes inactive (L level) when the end signal end rises to allow the D flipflop 211 to take in the data input (D) and change the inverted output (Q) to the L level. With the data input (D) of the D flipflop 211 being an H-level signal of a fixed value, once the D flipflop 211 takes in the data input (D), the inverted output ($\overline{Q}$) of the D flipflop 211 is kept at the L level until the D flipflop 211 is reset. Therefore, the match signal $M_i$ is masked in the AND gate 213, keeping the detection signal MDi inactive (L level). That is, the detection signal $MD_i$ output from the match signal active detection circuit 21 is active only during the period from the time when the match signal Mi has become active until the time when the end signal end is output, and is inactive otherwise. Thus, the match signal that has contributed to the output of the match signal active detection signal MD no more influences the subsequent output of the match signal active detection signal MD. Instead, another match signal becomes active to restart the output of the match signal active detection signal MD. In this way, every time a given match signal becomes active, the control circuit 20 detects this and outputs the match signal active detection signal MD.

The match signal active detection signal MD is used for operation control of the clock counting type associative memory 10 and the class identification circuit 33. More specifically, the control circuit 20 exclusively operates the clock counting type associative memory 10 and the class identification circuit 33 using the match signal active detection signal MD. For example, the clock counting type associative memory 10 may be configured so that the clock signal CLK be supplied when the match signal active detection signal MD is inactive. As for the class identification circuit 33, an example configuration will be described later.

<Example Configuration of K-Nearest Neighbors Clustering Circuit 30>

Referring back to FIG. 1, the k-nearest neighbors clustering circuit 30 includes a class data memory 31, X class counters 32, a class identification circuit 33, a maximum counter detection circuit 34, and a k-match signal count matching detection circuit 35.

The class data memory 31 is a circuit that holds R pieces of class data (class data 1, class data 2, . . . , and class data R) respectively representing the classes of the R pieces of reference data.

Each of the class counters 32 is a circuit for counting the number of pieces of data in the corresponding class. The total number of classes is X (X is an integer equal to or more than 2).

The class identification circuit 33 is a circuit that sequentially selects active match signals output from the clock counting type associative memory 10, reads class data corresponding to the selected match signals from the class data memory 31, and increments the class counters 32 corresponding to the classes represented by the read class data.

The k-match signal count matching detection circuit 35 increments the count value by one every time the class identification circuit 33 selects one match signal that has become active, to detect matching of the count value with k.

Figure 7:
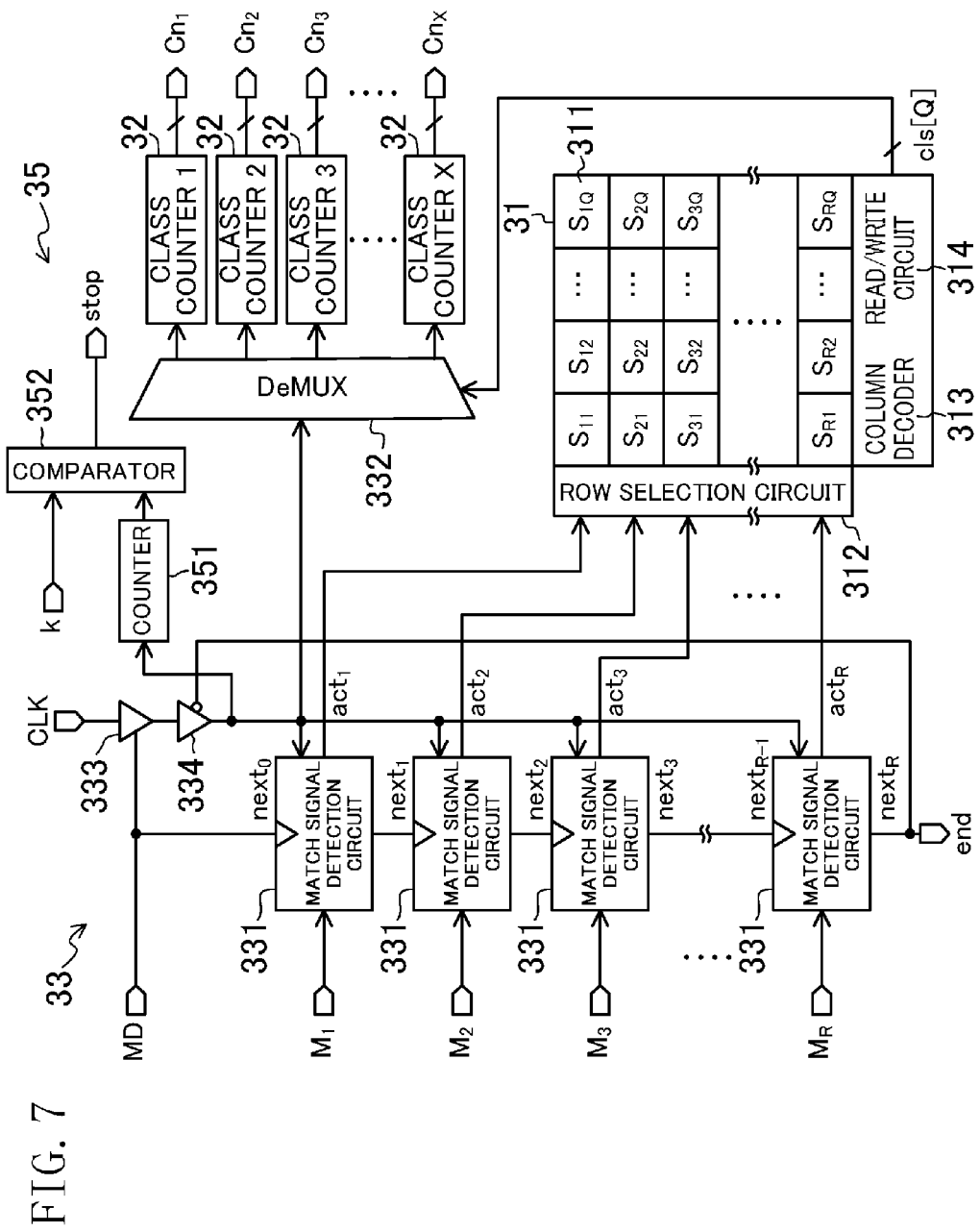
FIG. 7 is a schematic block diagram of an example class data memory, class counters, class identification circuit, and k-match signal count matching detection circuit.

FIG. 7 illustrates a schematic configuration of an example of the class data memory 31, the class counters 32, the class identification circuit 33, and the k-match signal count matching detection circuit 35.

The class data memory 31 includes a memory section 311, a row selection circuit 312, a column decoder 313, and a read/write circuit 314.

The memory section 311 includes class data storage cells $S_{11}$ to $S_{1Q}$, $S_{21}$ to $S_{2Q}$, . . . , and $S_{R1}$ to $S_{RQ}$, where Q is an integer equal to or more than 2.

The class data storage cells $S_{11}$ to $S_{1Q}$, $S_{21}$ to $S_{2Q}$, . . . , and $S_{R1}$ to $S_{RQ}$ store class data written by the row selection circuit 312, the column decoder 313, and the read/write circuit 314. Specifically, the class data storage cells $S_{11}$ to $S_{1Q}$ store class data 1 of N×Q (N is an integer equal to or more than 1) bits, the class data storage cells $S_{21}$ to $S_{2Q}$ store class data 2 of N×Q bits, and similarly, the class data storage cells $S_{R1}$ to $S_{RQ}$ store class data R of N×Q bits. In other words, each of the class data storage cells $S_{11}$ to $S_{1Q}$, $S_{21}$ to $S_{2Q}$, . . . , and $S_{R1}$ to $S_{RQ}$ stores N bits of class data.

The row selection circuit 312 designates addresses in the row direction in the memory section 311. The column decoder 313 designates addresses in the column direction in the memory section 311. The read/write circuit 314 reads/writes class data from/into any of the class data storage cells $S_{11}$ to $S_{1Q}$, $S_{21}$ to $S_{2Q}$, ..., and $S_{R1}$ to $S_{RQ}$ designated by the row selection circuit 312 and the column decoder 313.

The class identification circuit 33 includes R match signal detection circuits 331, a demultiplexer 332, and two buffers 333 and 334. The clock signal CLK is connected to the class identification circuit 33 via the serially connected buffers 333 and 334. With a transition of the match signal active detection signal MD output from the control circuit 20 to the H level, the clock signal CLK is supplied to the class identification circuit 33 via the buffers 333 and 334. With this supply, the class identification circuit 33 starts its operation. When the class identification operation by the class identification circuit 33 is terminated, the end signal end makes a transition to the H level. With this transition of the end signal end to the H level, the buffer 334 cuts off the supply of the clock signal CLK to the class identification circuit 33, whereby the class identification circuit 33 stops the operation.

The R match signal detection circuits 331 are provided to correspond to the R match signals output from the clock counting type associative memory 10. Each of the match signal detection circuits 331 is a circuit that detects the corresponding match signal being active and outputs a selection signal act to the class data memory 31 to select class data corresponding to the match signal.

The R match signal detection circuits 331 are serially connected to transmit an operation start signal. That is, the match signal detection circuits 331 are configured to operate sequentially when receiving the operation start signal in turn. The first-stage match signal detection circuit 331 starts the operation by receiving the match signal active detection signal MD as an operation start signal $next_0$, and outputs an operation start signal $next_1$ to the next-stage (second-stage) match signal detection circuit 331 when the operation is terminated. The second-stage match signal detection circuit 331 starts the operation by receiving the operation start signal $next_1$, and outputs an operation start signal $next_2$ to the next-stage (third-stage) match signal detection circuit 331 when the operation is terminated. Similarly, the final-stage (R-th stage) match signal detection circuit 331 starts the operation by receiving an operation start signal $next_{R-1}$, and outputs an operation start signal $next_R$ when the operation is terminated. The operation start signal $next_R$ is equivalent to the end signal end.

With a selection signal $act_1$ output from the match signal detection circuit 331 into which the match signal $M_1$ is input, the class data 1 is selected in the class data memory 31 and output therefrom. With a selection signal $act_2$ output from the match signal detection circuit 331 into which the match signal $M_2$ is input, the class data 2 is selected in the class data memory 31 and output therefrom. Similarly, with a selection signal $act_R$ output from the match signal detection circuit 331 into which the match signal $M_R$ is input, the class data R is selected in the class data memory 31 and output therefrom.

Figure 8:
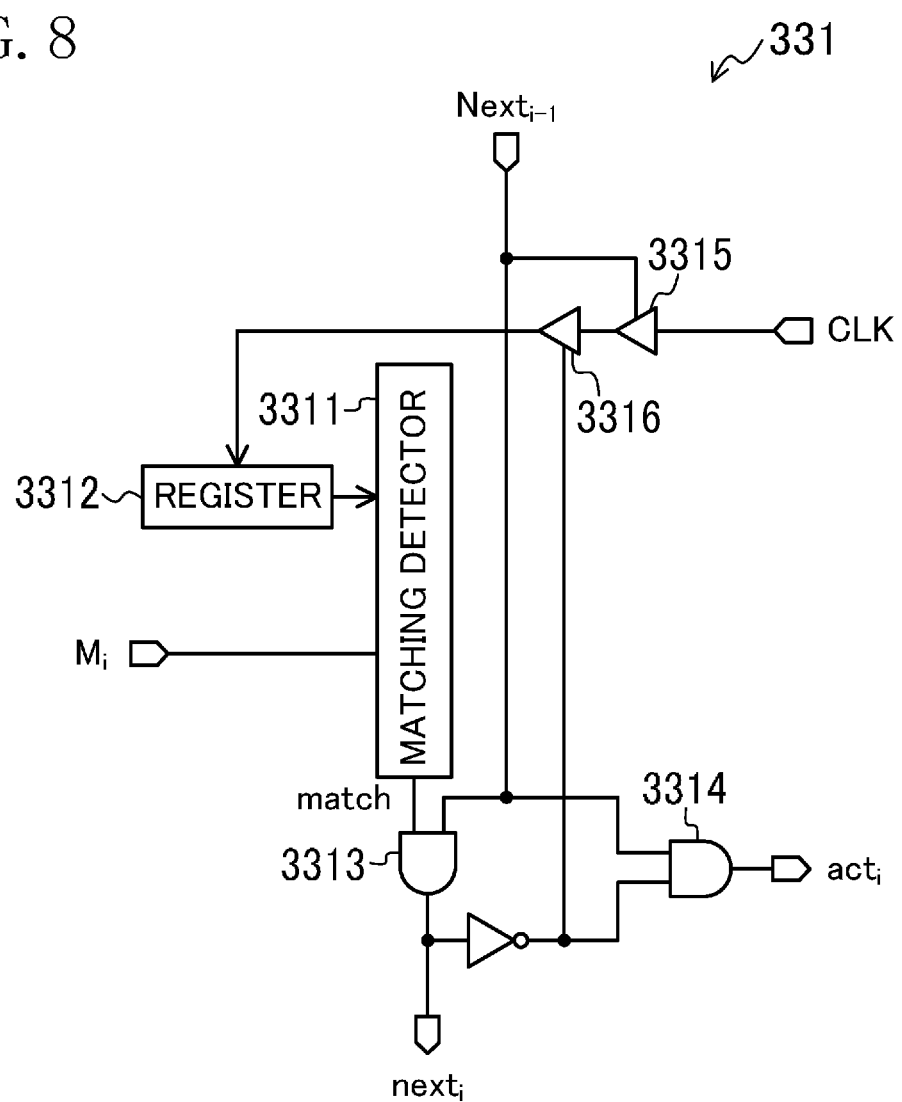
FIG. 8 is a schematic block diagram of an example match signal detection circuit.

FIG. 8 illustrates a schematic configuration of an example of the match signal detection circuit 331. The match signal detection circuit 331 includes a matching detector 3311 and a register 3312. The matching detector 3311 is a circuit that detects matching between a one-bit value held by the register 3312 and the match signal $M_i$ and outputs a matching signal match. The matching signal match becomes an H level when the two values match with each other, and becomes an L level when they do not match with each other. The matching signal match and an operation start signal $next_{i-1}$ input into the match signal detection circuit 331 are input into an AND gate 3313 for AND computation. The output of the AND gate 3313 is to be an operation start signal $next_i$ supplied to the next-stage match signal detection circuit 331. Also, the logical inversion of the matching signal match and the operation start signal $next_{i-1}$ are input into an AND gate 3314 for AND computation. The output of the AND gate 3314 is to be an selection signal $act_i$ for class data.

The register 3312 holds 0 as its initial value. Therefore, when the match signal $M_i$ is inactive, the two values match with each other, causing the matching signal match to become the H level. At this time, the output of the AND gate 3313 becomes the H level, whereby the operation start signal $next_{i-1}$ is supplied to the next-stage match signal detection circuit 331. At this time, also, the output of the AND gate 3314 becomes the L level, whereby the selection signal $act_i$ for class data is not output. In this way, when the match signal $M_i$ is inactive, the match signal detection circuit 331 does not output the selection signal for class data, but immediately transmits the input operation start signal to the next-stage match signal detection circuit 331.

By contrast, when the match signal $M_i$ is active, the two values do not match with each other, causing the matching signal match to become the L level. At this time, the output of the AND gate 3313 becomes the L level, and with input of the H-level operation start signal $next_{i-1}$, the AND gate 3314 outputs the H-level selection signal $act_i$.

The clock signal CLK is connected to the register 3312 via serially connected buffers 3315 and 3316. When the operation start signal $next_{i-1}$ becomes the H level, the buffer 3315 supplies the clock signal CLK to the buffer 3316. Further, when the inversion of the matching signal match becomes the H level, the buffer 3316 supplies the clock signal CLK to the register 3312. Receiving the clock signal CLK, the register 3312 changes the holding value to 1. With this, the active match signal $M_i$ and the holding value of the register 3312 match with each other, causing the matching signal match to become the H level. At this time, the output of the AND gate 3313 becomes the H level, whereby the operation start signal $next_{i-1}$ is supplied to the next-stage match signal detection circuit 331. At this time, also, the output of the AND gate 3314 becomes the L level, whereby the selection signal $act_i$ for class data makes a transition to the L level. In this way, when the match signal $M_i$ is active, the match signal detection circuit 331 transmits the input operation start signal to the next-stage match signal detection circuit 331 one clock cycle after the output of the selection signal for class data. The selection signal for class data output at this time remains the H level by one clock cycle.

Referring back to FIG. 7, the clock signal CLK is supplied to the demultiplexer 332 via the buffers 333 and 334, and output to a destination determined by the Q-bit class data cls output from the class data memory 31. That is, the class data cls is used as the signal for selecting any one of the X class counters 32. The class data is selected every clock cycle, and the clock signal CLK is input into the class counter 32 corresponding to the selected class data, whereby the count value of the corresponding class counter 32 is incremented by one.

The k-match signal count matching detection circuit 35 includes a counter 351 and a comparator 352. The counter 351 receives the clock signal CLK input under the same conditions as those under which the clock signal CLK is supplied to the class identification circuit 33, and counts the number of pulses. That is, the counter 351 is incremented by one every time the class identification circuit 33 selects one match signal that has become active. The comparator 352 is a circuit that compares an externally supplied value k with the count value of the counter 351. When the two values match with each other, the comparator 352 outputs a stop signal stop. Although not shown, the counter 351 is reset to its initial state by receiving a reset signal.

The stop signal stop can be used as a control signal for stopping the operation of the clock counting type associative memory 10. For example, the clock counting type associative memory 10 may be configured to shut off the supply of the clock signal CLK when having received the stop signal stop. With this configuration, when k match signals out of the R match signals $M_1$ to $M_R$ output from the clock counting type associative memory 10 have become active, the operation of the clock counting type associative memory 10 is stopped, preventing the other match signals from becoming active any more. In other words, the number of match signals becoming active can be limited to k.

The count values $Cn_1$ to $Cn_X$ of the X class counters 32 represent the numbers of neighbors in the classes. That is, the number of votes (number of pieces of data) of the classes are known by referring to the count values $Cn_1$ to $Cn_X$. The maximum counter detection circuit 34 is a circuit that finds the class counter having the largest count value out of the X class counters 32.

Figure 9:
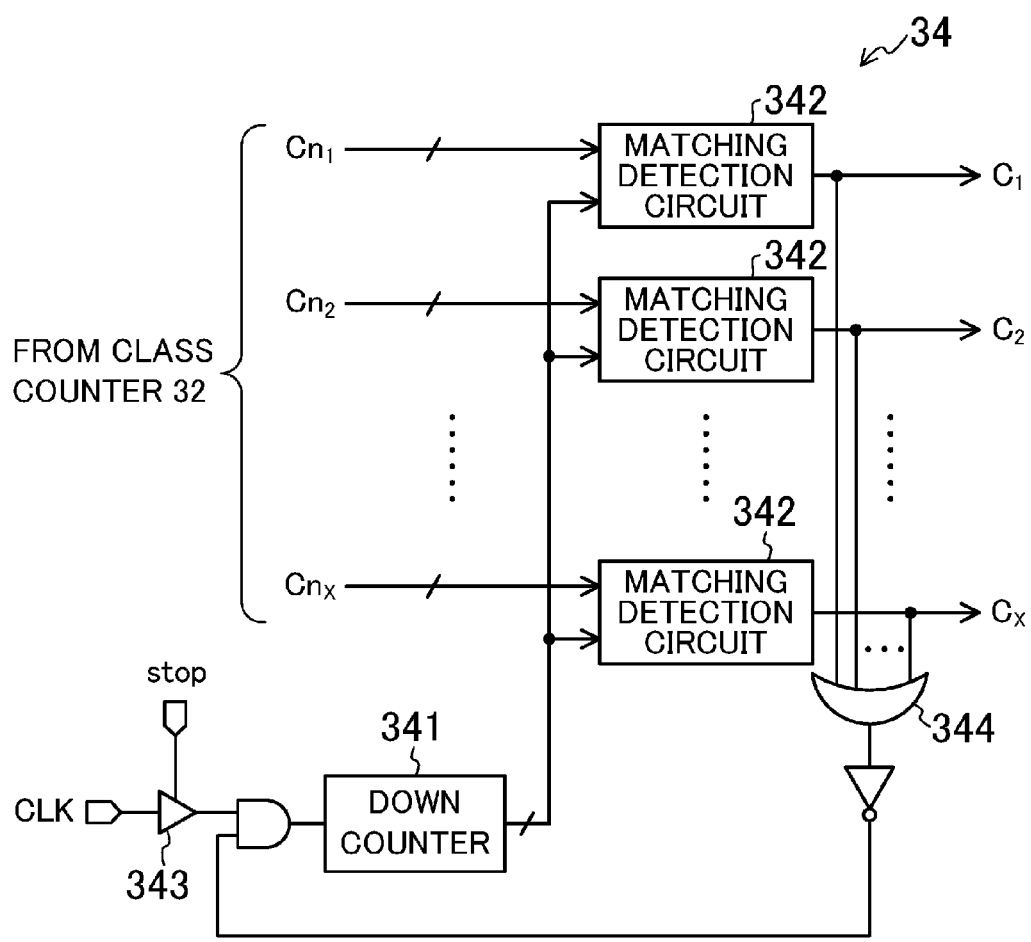
FIG. 9 is a schematic block diagram of an example maximum counter detection circuit.

FIG. 9 illustrates a schematic configuration of an example of the maximum counter detection circuit 34. The maximum counter detection circuit 34 includes a down counter 341 and X matching detection circuits 342. The down counter 341 is a circuit that counts down from the initial value when receiving the clock signal CLK. The clock signal CLK is supplied to the down counter 341 via a buffer 343. The buffer 343 supplies the clock signal CLK to the down counter 341 when receiving the stop signal stop output from the k-match signal count matching detection circuit 35.

The X matching detection circuits 342 are provided to correspond to the X class counters 32. The matching detection circuits 342 are circuits that detect matching between the count values of the corresponding class counters 32 and the count value of the down counter 341, and output matching signals $C_1$ to $C_X$. The matching detection circuits 342 change the matching signals $C_1$ to $C_X$ to the H level once having detected matching.

The output signals of the X matching detection circuits 342 are input into an OR gate 344, where OR of these signals is computed. A configuration is made so that the clock signal CLK input into the down counter 341 is masked by logical inversion of the output of the OR gate 344. That is, a configuration is made so that the count operation of the down counter 341 is stopped when matching between the count value of the down counter 341 and the count value of the corresponding class counter 32 has been detected by any one of the X matching detection circuits 342 during the countdown of the count value of the down counter 341. With this configuration, only the class counter 32 holding the largest count value can be detected. Any of the matching signals $C_1$ to $C_X$ that is in the H level represents the class of the search data determined based on the k-nearest neighbors algorithm.

Figure 10:
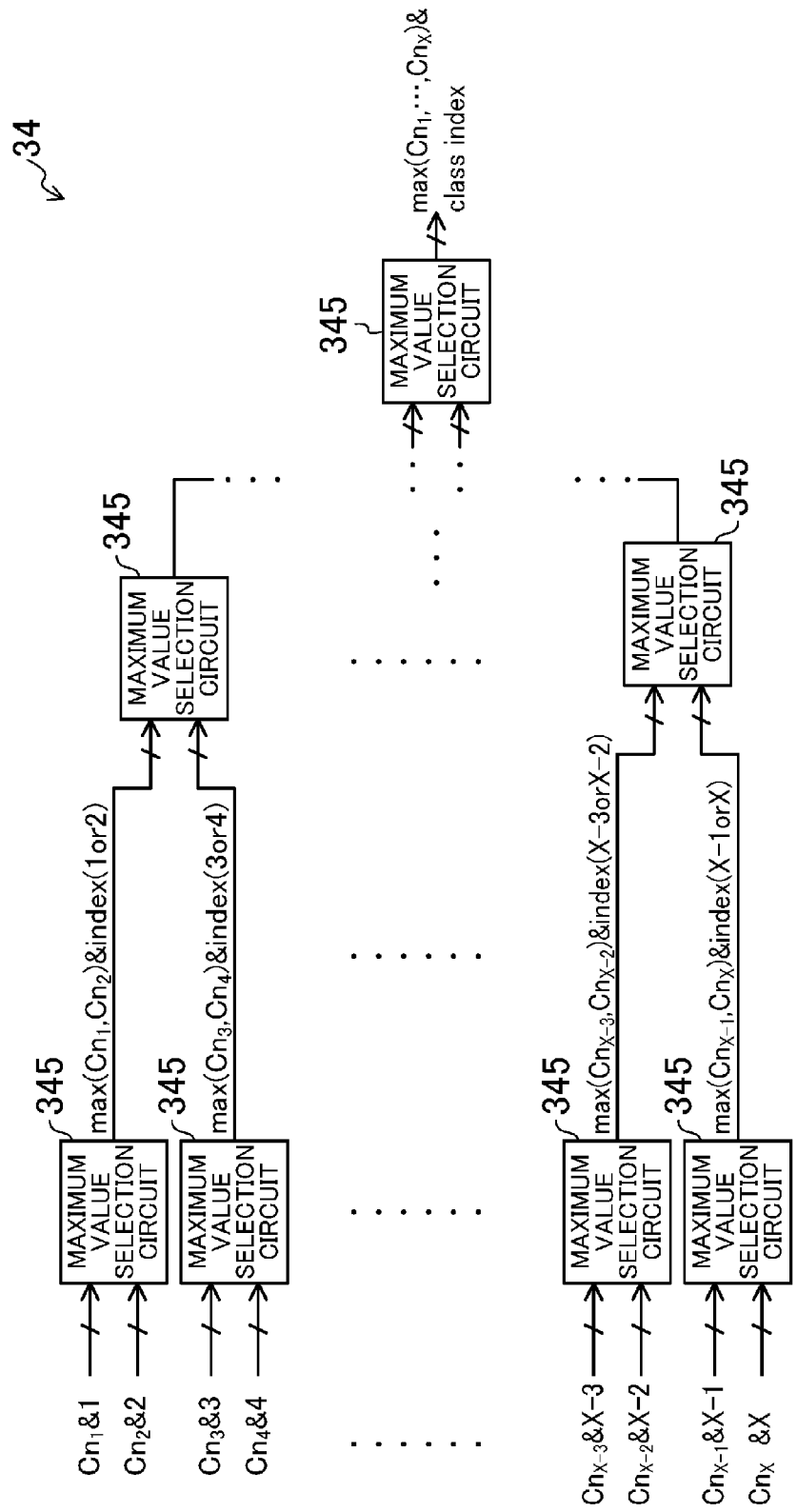
FIG. 10 is a schematic block diagram of another example maximum counter detection circuit.

FIG. 10 illustrates a schematic configuration of another example of the maximum counter detection circuit 34. The maximum counter detection circuit 34 can also be configured as a tournament circuit where a plurality of maximum value selection circuits 345 are connected in a tree form.

Figure 11:
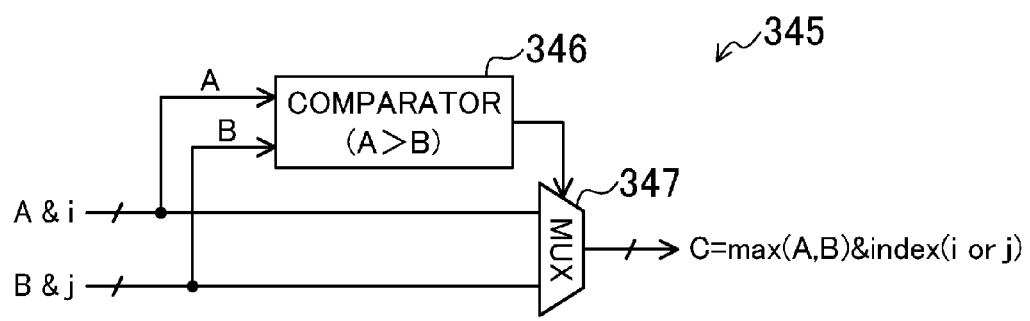
FIG. 11 is a schematic block diagram of an example maximum value selection circuit.

FIG. 11 illustrates a schematic configuration of an example of the maximum value selection circuit 345. The maximum value selection circuit 345 includes a comparator 346 and a multiplexer 347.

A concatenated signal A&i of a count value A of a given class counter 32 and the identification number i of this class counter 32 and a concatenated signal B&j of a count value B of another class counter 32 and the identification number j of this class counter 32 are input into the maximum value selection circuit 345. The comparator 346 compares the magnitude between the count value A and the count value B. The multiplexer 347 receives the signals A&i and B&j, and outputs either one of the signals A&i and B&j as a signal C in accordance with the output signal of the comparator 346. More specifically, the multiplexer 347 outputs the signal A&i when A≥B and the signal B&j when A<B. That is, as the signal C, output is a concatenated signal of a count value max (A,B) of the class counter 32 having a larger count value and the identification number index (i or j) of this class counter. Note that the multiplexer 347 may output the signal A&i when A>B and the signal B&j when A≤B.

Referring back to FIG. 10, X/2 maximum value selection circuits 345 are arranged at the leaf nodes of the tournament circuit. Each of the maximum value selection circuits 345 at the leaf nodes receives concatenated signals of the counter values of two adjacent class counters 32, out of the X class counters 32, and the identification numbers of these two class counters 32.

At the second level of the tournament circuit, $X/2^2$ maximum value selection circuits 345 are arranged. Each of the maximum value selection circuits 345 at the second level receives signals output from two adjacent maximum value selection circuits 345 at the leaf nodes.

One maximum value selection circuit 345 is arranged at the root node of the tournament circuit. From the maximum value selection circuit 345 at the root node, output is a concatenated signal of the maximum count value max $(Cn_1, \ldots, Cn_X)$ of the X class counters 32 and the class index as the identification number of this class counter 32.

The maximum counter detection circuit 34 having the above-described configuration, which can determine the maximum value of the X class counters 32 in one clock cycle, is especially suitable for high-speed processing.

As described above, according to this embodiment, by the clock counting type associative memory 10, the distance between the search data and each piece of reference data is converted to the number of clocks, to make the match signal corresponding to the reference data active at the timing corresponding to the distance. And, by the k-nearest neighbors clustering circuit 30, a class having the largest number of pieces of data is determined when k pieces of class data corresponding to k match signals that have become active earlier are classified by class. In this way, classification of search data based on the k-nearest neighbors algorithm is achieved.

In this embodiment, since class identification is performed every time any of the R match signals output from the clock counting type associative memory 10 becomes active, distance information is lost. To solve this problem, a counter may be provided in the class identification circuit 33, for example, to hold time information (i.e., time-converted distance information) indicating the time required until each match signal becomes active. In this case, the class data may be weighted using the time information to ensure a larger weight for a piece of reference data closer in distance to the search data, thereby enabling higher-degree class identification. It is also possible to exclude any reference data, out of the pieces of reference data corresponding to the k active match signals, of which the distance from the search data is equal to or more than a threshold, and apply the k-nearest neighbors algorithm using less than k match signals.

In the k-nearest neighbors associative memory of the prior application, a plurality of adders were connected in a tree form to constitute a match signal count circuit. The R match signals output from the clock counting type associative memory 10 were connected to the match signal count circuit, to count k match signals that have become active earlier. By contrast, in the k-nearest neighbors associative memory according to this embodiment, k match signals that have become active earlier can be counted without use of such a tree of adders. Thus, the circuit scale, the power consumption, and the delay time can be further reduced.

Various embodiments have been described above as example techniques of the present disclosure, in which the attached drawings and detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A k-nearest neighbors associative memory device, comprising:
    a clock counting type associative memory that holds R pieces of reference data and outputs, for each of the R pieces of reference data, a match signal that becomes active when a clock count corresponding to a distance between the reference data and given search data has been reached, the distance being calculated using a threshold distance calculation method; and
    a k-nearest neighbors clustering circuit that, every time at least one of a R match signals output from the clock counting type associative memory becomes active, selects a piece of class data, out of R pieces of class data representing a plurality of classes of the R pieces of reference data, corresponding to each of the at least one active match signal, until any k match signals out of the R match signals become active, and determines a class of the plurality of classes having a largest number of pieces of data when a selected total of k pieces of class data are classified according to their respective classes, wherein
    the k-nearest neighbors clustering circuit has
        a class data memory that holds the R pieces of class data,
        X class counters corresponding to X classes, where the R pieces of data are classified into a total number of X classes where X is an integer equal to 2 or more,
        a class identification circuit that sequentially selects the at least one active match signal, reads a piece of class data corresponding to the selected match signal from the class data memory, increments a class counter corresponding to the corresponding class represented by the piece of read class data, and outputs an end signal once selection of all of the at least one active match signal has been completed,
        a maximum counter detection circuit that finds the class counter having the largest count value, out of the X class counters, and
        a k-match signal count matching detection circuit that increments a count by one every time the class identification circuit selects one active match signal, and detects matching of a count value with k,
    the k-nearest neighbors associative memory device further comprises a control circuit that stops an operation of the clock counting type associative memory and operates the class identification circuit when at least one of the R match signals becomes active, and stops an operation of the class identification circuit and operates the clock counting type associative memory when the end signal is output from the class identification circuit, and
    the clock counting type associative memory is configured to stop its operation when matching of the count value with k has been detected by the k-match signal count matching detection circuit.

2. The k-nearest neighbors associative memory device of claim 1, wherein
    the control circuit has
        R match signal active detection circuits provided for the R match signals, each outputting a detection signal that is active during a period from a time when the corresponding match signal has become active until a time when the end signal is output from the class identification circuit, and
        an OR gate that computes OR of the R detection signals output from the R match signal active detection circuits, and
    the operations of the class identification circuit and the clock counting type associative memory are controlled with an output signal of the OR gate.

3. The k-nearest neighbors associative memory device of claim 1, wherein
    the class identification circuit has R match signal detection circuits provided for the R match signals, each detecting that the corresponding match signal is active and outputting a selection signal for selecting class data corresponding to the match signal to the class data memory,
    the R match signal detection circuits are serially connected to transmit an operation start signal, and
    each of the R match signal detection circuits is configured to transmit an input operation start signal to a next stage immediately when the corresponding match signal is inactive, and output the selection signal once receiving the operation start signal and then transmit the operation start signal to the next stage when the corresponding match signal is active.

4. The k-nearest neighbors associative memory device of claim 1, wherein
    the maximum counter detection circuit includes
        a down counter that counts down a count value from an initial value, and
        X number of matching detection circuits provided for the X class counters, each detecting matching between a count value of the corresponding class counter and the count value of the down counter, and
    a count operation of the down counter is stopped when matching between the count value of the down counter and the count value of the corresponding class counter is detected by any one of the X matching detection circuits.

5. The k-nearest neighbors associative memory device of claim 1, wherein the maximum counter detection circuit includes a tournament circuit where a plurality of 2-input, 1-output maximum value selection circuits are connected in a tree form, concatenated signals of the count values of the X class counters and identification numbers of the class counters are input into a plurality of maximum value selection circuits at leaf nodes, and a concatenated signal of a maximum one of the count values of the X class counters and the identification number of the class counter having the maximum count value is output from a maximum value selection circuit at a root node, and each of the maximum value selection circuits receives a first concatenated signal of a count value of a first class counter and an identification number of the first class counter and a second concatenated signal of a count value of a second class counter and an identification number of the second class counter, and outputs a third concatenated signal of the count value of the first or second class counter whichever is larger in count value and the identification number of the class counter.

* * * * *